June 4, 1963 R. O. ROBINSON, JR 3,092,028

OSCILLATOR

Filed July 16, 1952 2 Sheets-Sheet 1

RALPH O. ROBINSON, JR.
INVENTOR

BY [signatures]
ATTORNEYS

June 4, 1963 R. O. ROBINSON, JR 3,092,028

OSCILLATOR

Filed July 16, 1952 2 Sheets-Sheet 2

RALPH O. ROBINSON, JR.
INVENTOR

BY [signatures]
ATTORNEYS

United States Patent Office 3,092,028
Patented June 4, 1963

3,092,028
OSCILLATOR

Ralph O. Robinson, Jr., Silver Spring, Md., assignor to the United States of America as represented by the Secretary of the Navy Filed July 16, 1952, Ser. No. 299,123
9 Claims. (Cl. 102—70.2)

This invention relates, in general, to radio proximity fuzes, and more particularly to an oscillator arrangement for generating high frequency radio signals.

The invention is directed to an oscillator which employs an apertured conducting plate as its frequency determining element. Since it is the size of the aperture and not the extent of the conductive plate that determines the operational characteristics of the oscillator, it will be well understood that the conductive plate may be of any desired shape and size, and may, therefore, form all or part of any existing device that is to carry the oscillator, such as a radio proximity fuze, skin of an airplane, or other device of this type.

It is one of the objects of this invention to provide an oscillator which employs an apertured conducting plate as its frequency determining element.

Still another object of the invention is to provide an oscillator arrangement in which its operational characteristics are determined by the size of the aperture.

To provide a radio frequency oscillator arrangement for a proximity fuzed projectile which utilizes a mounting plate or the like to provide grid and anode capacitance and inductance, is still another object of the invention.

And another object of the invention is to provide an oscillator in which its conducting plate forms all or part of any existing device that is to carry the oscillator, such as radio proximity fuzed projectiles.

Another object of the invention is to provide an oscillator unit which is simple in construction, and reliable and efficient in operation.

Other objects and many of the attendant advantages of this invention will be readily appreciated as the same becomes better understood by reference to the following detailed description when considered in connection with the accompanying single drawing, and in which.

According to the invention, a radio frequency oscillator unit is provided for use with proximity fuzed antiaircraft and artillery projectiles. A triode tube is mounted in a non-conducting material, such as "Teflon," which is then placed in a bore cut into a mounting plate in the base of the projectile. Oscillator elements are also provided in the "Teflon" plug and are so arranged that the energy from the anode is returned to the grid circuit to induce oscillations. This return is made through the utilization of distributed inductance and capacitance of the mounting plate formed in the base of the projectile. The electrical characteristics of the mounting plate may be changed by changing the shape of the bore formed in the mounting plate. Radio frequency energy may be taken out of the oscillator unit by an antenna connected to the mounting plate, or by electromagnetic radiation from the oscillator aperture itself. Suitable connections are made from the oscillator unit through openings in a plug element located above the oscillator unit to other fuze components such as the reserve battery, amplifier, and safety unit, squib and auxiliary detonator.

In another embodiment of the invention, the oscillator unit utilizes a thin aperture conducting plate as its frequency determining element.

Figure 1:
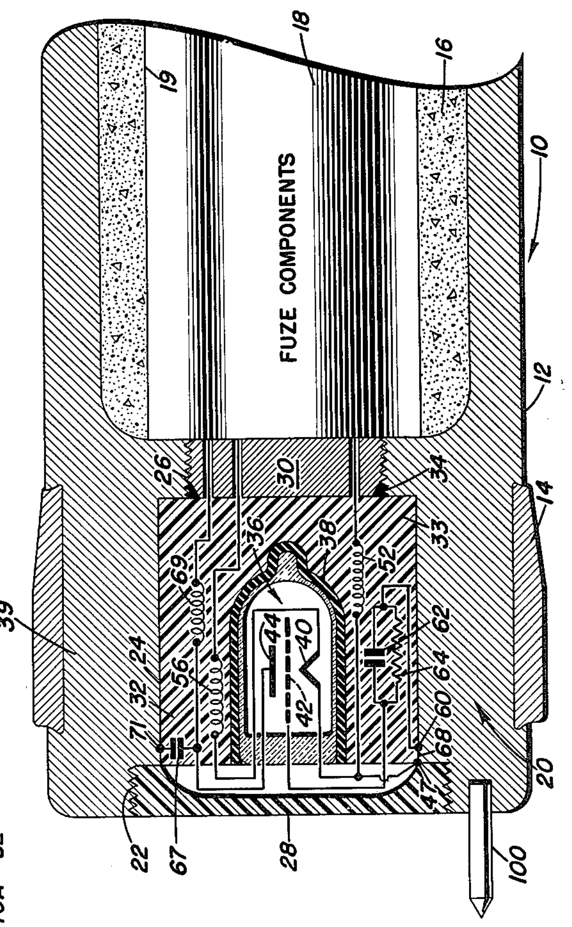
FIG. 1 is an axial section through the rear portion of a projectile, embodying the features of the invention.

Referring now to FIG. 1 of the drawing, there is shown a portion of an anti-aircraft or artillery projectile 10 having a rear portion 12 on which there is mounted a rotating band 14, and also having a cavity 16 formed therein for receiving the explosive charge and certain other fuze components 18 mounted in a container 19, which will be explained more fully hereinafter. The base portion 20 of projectile 10 has three bores 22, 24, and 26 formed therein. These bores 22, 24, and 26 have the same longitudinal axis as the axis of the projectile 10 and are located as shown in FIG. 1. Bores 22 and 26 receive threaded plug elements 28 and 30. Plug element 28 is a protective plate for the apertured reaction oscillator arrangement 32 which is located thereabove. This plug element or protective plate 28 is usually formed of a dielectric material, such as "Teflon." On the other hand, the plug element 30 is usually formed of steel, and is located as shown. Around the periphery of steel plug 30 there is provided a gas sealing arrangement 34 consisting of pressed-in lead.

Between plug elements 28 and 30, there is located the oscillator arrangement 32 comprising the present invention, and which has been previously mentioned. The arrangement comprises a plug 33 of non-conducting material, such as "Teflon," which is mounted in bore 24. Within this plug of "Teflon" material there is located a triode tube 36 having a tube sock 38 thereabouts for protection against acceleration forces and the like, and certain resistance, capacitance, and inductance elements, which will be described more specifically subsequently. These elements are connected by leads through suitable openings in plug 30 to the fuze components 18 located in container 19 forward of the plug element 30.

The portion 39 of base 20, which is the mounting plate for the oscillator arrangement 32, can have any arbitrary thickness, and it is not necessary that the bore 24 extend entirely through portion 39 of base 20. However, it is preferable that the depth of the bore 24 exceed the bore diameter or transverse dimension.

Figure 2:
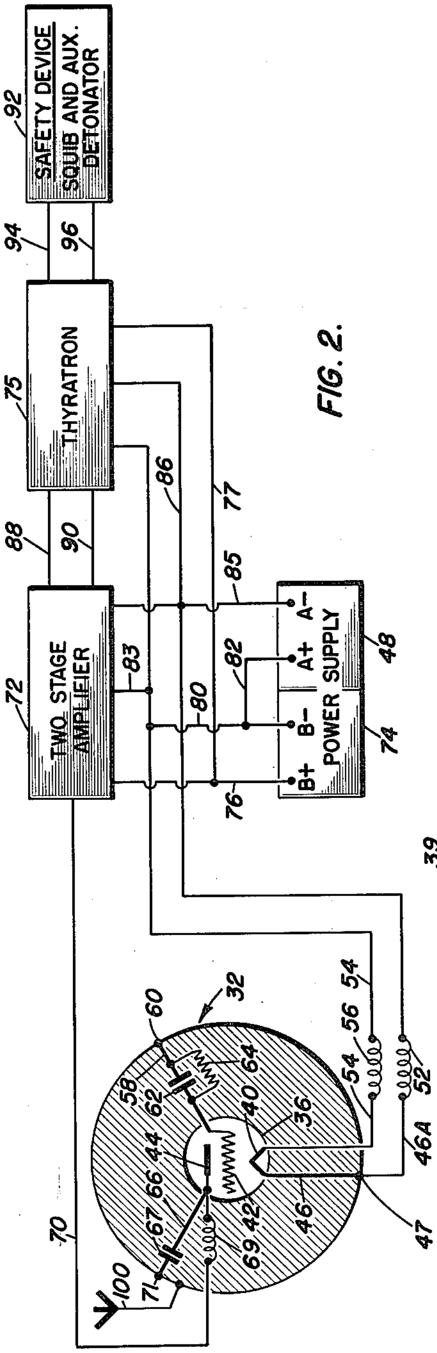
FIG. 2 is a block diagram of the oscillator unit illustrated in FIG. 1.

Referring now to FIG. 2 of the drawing, there is shown a schematic of the electrical connections for the oscillator arrangement 32. Triode tube 36 comprises a filament 40, a grid 42 and a plate 44. One terminal of the filament 40 is connected by a heavy lead (to minimize losses) to a point 47 on th lower surface 68 of bore 24 and thence by a light lead 46A to the —A terminal of a battery 48 through a suitable radio frequency choke coil 52, while the other terminal of filament 40 is connected by leads 54, 80, and 82 to the +A terminal of battery 48 through a second suitable radio frequency choke coil 56.

The grid 42 of triode 36 is connected by a heavy lead 58 to a point 60 on the surface defining the lower portion 68 of bore 24. Between grid 42 and point 60 there is provided a capacitor 62 shunted by a resistor 64. The anode or plate 44 of tube 36 is connected by a heavy lead 66 to a blocking capacitor 67, and thence to a point 71 on the surface defining the lower portion 68 of bore 24, as shown in FIG. 1. It is to be noted that points 47, 60, and 71, all of which are on the surface defining the lower portion of bore 24, are separted by approximately 120° for the circular aperture shown, and are in substantially the same transverse plane. However, this is not essential for operation of the oscillator arrangement, since positions 47, 60, and 71 can be other than approximately 120° apart. When other types of apertures are used, other than circular, points corresponding to 47, 60, and 71 would be determined in a similar manner so that the currents due to oscillation would have similar phase and amplitude relations. The exact spacing of points 47, 60, and 71 depends upon the electrical properties of the triode 36, the physical dimensions of the aperture, and the circuit. The anode or plate 44 of tube 36 is connected through a third suitable radio frequency choke coil 69 by lead 70 to the input of a two-stage amplifier unit 72 located with the fuze components 18.

A second battery 74, together with battery 48, supplies power for the amplifier 72. The +B terminal of battery 74 is connected to the two stage amplifier 72 and a thyratron 75 by leads 76 and 77. The −B terminal of battery 74, on the other hand, is connected to the amplifier 72 and thyratron 75 by leads 80, 54, and 83. The −B terminal of battery 74 and the +A terminal of battery 48 are connected together through lead 82. The −A terminal of battery 48, in addition, is connected to amplifier 72 and thyratron 75 by leads 85 and 86. The output of amplifier 72 is connected to the input of thyratron 75 by leads 88 and 90. A safety unit 92, including a firing squib, and an auxiliary detonator, is connected by leads 94 and 96 to the output of thyratron 75. The reserve batteries 48 and 74, as well as the two-stage amplifier 72, the thyratron 75, and the safety unit 92, are conventional and are described more fully in Electronics, Volume 19, 1946, in an article entitled, "Proximity Fuzes for Artillery," pp. 104–109.

The arrangement described heretofore is used primarily as a radio frequency oscillator, wherein the arcuate portions of the mounting plate 39 surrounding the bore 24 constitute the distributed grid and anode capacitance and inductance. The energy output of the oscillator arrangement may be drawn off at any properly placed tap at the edge of the bore 24. For example, an antenna rod 100 may be screwed in or connected to the base plate 20 as shown, preferably at or near an anti-nodal point of the oscillations. This antenna 100 should, preferably, be mounted to extend perpendicular to the base plate 20. However, it is to be mentioned that it is not necessary to use an antenna, such as 100, since sufficient radio frequency energy may radiate directly from the oscillator aperture itself.

Figure 3:
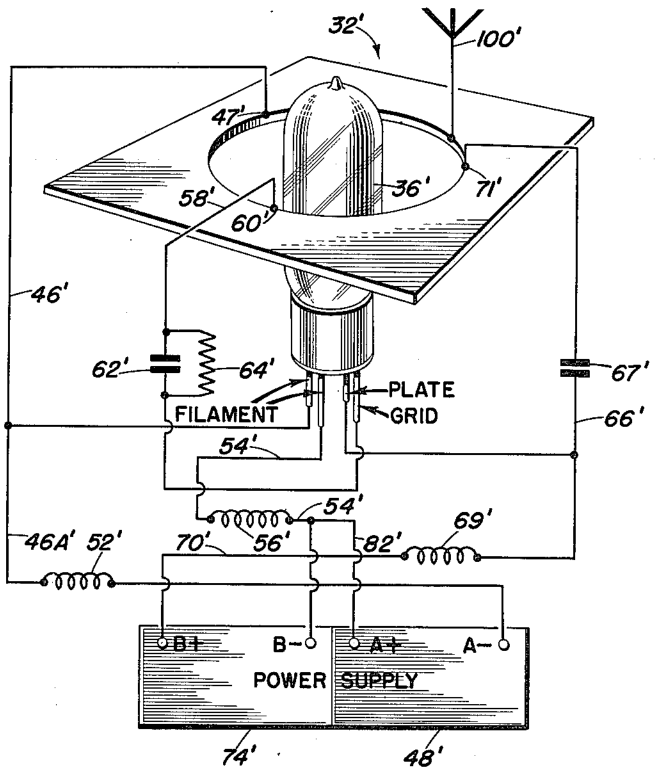
FIG. 3 is a schematic, partially in perspective, of an oscillator employing an apertured conducting plate.

It may be well to point out that while a circular aperture or bore 24 has been illustrated, this does not imply any restrictions on the shape of said bore or aperture, which may also be oval, polygonal or even irregular or rough in outline, and will still operate efficiently. Because of this, the invention may be applied to almost any device that includes or can carry a conducting surface, like the skin of an aircraft or a motor vehicle or the like. For example, in FIG. 3, there is illustrated an oscillator unit similar to that described in FIGS. 1 and 2, which employs an apertured conducting plate 32′ as its frequency determining element. The conducting plate 32′ could be a portion of the skin of an aircraft or a motor vehicle or the like. All the elements illustrated in this embodiment of the invention correspond in structure and function to those described and illustrated in the embodiment of the invention in FIGS. 1 and 2, that is, elements 32′, 36′, 46′, 46A′, 47′, 48′, 52′, 54′, 56′, 58′, 60′, 62′, 64′, 66′, 67′, 69′, 70′, 71′, 74′, 82′, and 100′, correspond in structure and function to elements 32, 36, 46, 46A, 47, 48, 52, 54, 56, 58, 60, 62, 64, 66, 67, 69, 70, 71, 74, 82, and 100, respectively.

In operational use the anti-aircraft or artillery projectile 10 is fired from a suitable weapon. After the batteries 48 and 74 have been activated by suitable means, the oscillator arrangement described so far oscillates at the desired frequency. The energy therefrom is radiated by antenna 100 or by the aperture itself into space and is reflected back by means of a suitable target. This reflected energy or signal is again picked up by antenna 100 or the aperture and is fed to the amplifier unit 72 located with the fuze components 18 where it is amplified and then fed to a thyratron or triggering tube 75. The output from the thyratron tube 75 is used to fire a firing condenser (not shown), which, in turn, sets off the firing squib and auxiliary detonator and subsequently the main explosive charge 16 of projectile 10.

Obviously many modifications and variations of the present invention are possible in the light of the above teachings. It is, therefore, to be understood that within the scope of the appended claims the invention may be practiced otherwise than as specifically described.

What is claimed is:

1. An oscillator arrangement for generating electromagnetic radiation, comprising, a conducting sheet having an aperture formed therein, a vacuum tube mounted in said aperture and including an anode, a grid, and a cathode, an electrical circuit including a power supply, circuit connections for connecting said anode, grid, and cathode to spaced points along the periphery of the aperture of said sheet and to said vacuum tube and power supply, the portions of said sheet located between said spaced points constituting distributed inductance and capacitance, and means for radiating the electromagnetic radiation generated by said oscillator arrangement.

2. An arrangement as set forth in claim 1, wherein said last mentioned means is constituted by the periphery of the aperture of said conducting sheet.

3. An arrangement as set forth in claim 1, wherein said last mentioned means is constituted by an antenna electrically connected to the periphery of said aperture in said sheet.

4. In combination with a body having a conducting sheet with an aperture formed therein, an oscillator arrangement for generating electromagnetic radiation, including a vacuum tube mounted in said aperture and having an anode, a grid, and a cathode, an electrical circuit including a power supply, circuit connections for connecting said anode, grid, and cathode to spaced points along the periphery of the aperture of said sheet and to said vacuum tube and power supply, the portions of said sheet located between said spaced points constituting distributed inductance and capacitance, and means for radiating the electromagnetic radiation generated by said oscillator arrangement.

5. An arrangement as set forth in claim 4, wherein said last mentioned means is constiuted by the periphery of the aperture of said conducting sheet.

6. An arrangement as set forth in claim 4, wherein said last mentioned means is constituted by an antenna electrically connected to the periphery of said aperture in said sheet.

7. In a projectile having a cavity formed in its base, an explosive charge and having mounted therein amplifier means, a thyratron tube electrically connected to said amplifier means, and a detonating means electrically connected to the output of said thyratron tube for exploding said explosive charge; the combination with an oscillator arrangement for generating electromagnetic radiation, a vacuum tube mounted in said cavity and including an anode, a grid, and a cathode, an electrical circuit including a power supply, circuit connections for connecting said anode, grid, and cathode to spaced points along the periphery of said cavity in said base and also to said amplifier means, thyratron tube, and power supply, the portions of said base located between said spaced points constituting distributed inductance and capacitance, and means for radiating and receiving the electromagnetic radiation generated by said oscillator arrangement.

8. In combination with a projectile having an explosive charge and a cavity in the base thereof, a radio proximity fuze comprising an oscillator arrangement for generating electromagnetic radiation, a vacuum tube mounted in said cavity and including an anode, a grid, and a cathode, an electrical circuit including amplifying means electrically connected to said oscillator arrangement, a thyratron tube connected to the output of said amplifying means, means electrically connected to the output of said thyratron tube for detonating said explosive charge, and a power supply electrically connected to said oscillator arrangement, amplifying means, thyratron tube, and detonating means, other circuit connections for connecting said anode, grid, and cathode to spaced points along the periphery of said cavity in said base, the portions of said base located between said spaced points constituting distributed inductance and capacitance, and means for radiating and receiving the electromagnetic radiation generated by said oscillator arrangement.

9. An oscillator arrangement for generating electromagnetic radiation, comprising, a conducting member having a cavity formed therein, the depth of said cavity being greater than the diameter thereof, a vacuum tube mounted in said cavity and including an anode, a grid, and a cathode, an electrical circuit including a power supply, first and second radio frequency chokes, said cathode being connected to said power supply through said first and second radio frequency chokes and to said conducting member, first and second capacitors, a resistor, said grid being connected to D.C. ground through said first capacitor shunted by said resistor and retained at a high R.F. potential by virtue of the location of the grid connection to said conducting member, a third radio frequency choke, said anode also being connected to said power supply through said third radio frequency choke and also to said conducting member through said second capacitor, the portions of said conducting member located between the connections from said cathode, grid, and anode to said conducting member constituting distributed inductance and capacitance, and means for radiating the electromagnetic radiation generated by said oscillator arrangement.

References Cited in the file of this patent

UNITED STATES PATENTS

| | | |
|---|---|---|
| 2,190,712 | Hansen | Feb. 20, 1940 |
| 2,438,832 | Turner | Mar. 30, 1948 |
| 2,451,502 | Lisman et al. | Oct. 19, 1948 |

FOREIGN PATENTS

| | | |
|---|---|---|
| 459,348 | Great Britain | Jan. 6, 1937 |
| 573,621 | Great Britain | Nov. 29, 1945 |